(12) United States Patent
Kase et al.

(10) Patent No.: US 8,013,855 B2
(45) Date of Patent: Sep. 6, 2011

(54) METHOD AND PROGRAM FOR GENERATING BOUNDARY SURFACE INFORMATION

(75) Inventors: Kiwamu Kase, Wako (JP); Yoshinori Teshima, Wako (JP); Yutaka Otake, Wako (JP)

(73) Assignee: Riken, Saitama (JP)

( * ) Notice: Subject to any disclaimer, the term of this patent is extended or adjusted under 35 U.S.C. 154(b) by 998 days.

(21) Appl. No.: 11/817,176

(22) PCT Filed: Mar. 2, 2006

(86) PCT No.: PCT/JP2006/303963
§ 371 (c)(1),
(2), (4) Date: Aug. 27, 2007

(87) PCT Pub. No.: WO2006/095629
PCT Pub. Date: Sep. 14, 2006

(65) Prior Publication Data
US 2009/0040217 A1    Feb. 12, 2009

(30) Foreign Application Priority Data
Mar. 9, 2005 (JP) ................. 2005-065929

(51) Int. Cl.
G06T 15/30 (2011.01)
(52) U.S. Cl. .................. 345/423; 345/420
(58) Field of Classification Search .......... 345/423, 345/420
See application file for complete search history.

(56) References Cited

FOREIGN PATENT DOCUMENTS

| JP | 07-230487 | 8/1995 |
|---|---|---|
| JP | 2000-076485 | 3/2000 |
| JP | 2000-076486 | 3/2000 |
| JP | 2002-230054 | 8/2002 |
| JP | 3468464 | 9/2003 |
| WO | 03/048980 | 6/2003 |
| WO | 03/073335 | 9/2003 |

OTHER PUBLICATIONS

J.Peterson,"Tessellation of NURB Surfaces", Graphics Gems IV, edited by P.Heckbert, Academic press,pp. 286-320, (1994).
L.Kobbelt, M.Botsch, U.Schwanecke, and H.-P.Seidel, "Feature-sensitive surface extraction from volume data", in Proceedings of SIGGRAPH2001, ACM Press / ACM SIGGRAPH, Computer Graphics Proceedings, Annual Conference Series, pp. 57-66,(2001).
T., Ju, R.Losasso, S.Schaefer, and J.Warren, "Dual contouring of Hermite data", ACM Transactions of Graphics vol. 21 No. 3, (Proc. of ACM SIGGRAPH 2002), pp. 339-346, (2002).
G.Taubin, "Dual mesh resampling", Proc.of Paciphic Graphics, pp. 180-188(2001).

(Continued)

Primary Examiner — Xiao M Wu
Assistant Examiner — Scott E Sonners
(74) Attorney, Agent, or Firm — Griffin & Szipl, P.C.

(57) ABSTRACT

A method includes: an input step of inputting boundary surface information 11 on an object to a computer using the computer; a grid sampling step of determining cutting points 13 where the boundary surface cuts across edges of a predetermined rectangular parallelepiped grid 12 and normal vectors 14 of the boundary surface at the cutting points, and storing them in a storage unit as primary data 15; a D-polyhedron data generation step of connecting adjacent cutting points with a line segment to form a triangle one by one for generating D-polyhedron data 16 constituted of triangles only; and a V-polyhedron data generation step of generating V-polyhedron data 17 constituted of intersections of a plurality of infinite planes passing through the cutting points and whose normals coincide with the normal vectors. Any one of the D-polyhedron data and the V-polyhedron data is generated from the primary data 15, and the other is generated as a dual.

2 Claims, 5 Drawing Sheets

OTHER PUBLICATIONS

Y.Ohtake et al., "Dual/Primal mesh optimization", 7th ACM Simposium on Solid Modeling and Application, pp. 171-178, (2002).

Kokichi Sugihara, Computational Geometry in Engineering (in Japanese), Baifu-kan, Tokyo, 1994.

W.Lorensen and H.Cline,"Marching cubes: high resolution 3D surface construction algorithm", ACM Computer Graphics (Proc. of ACM SIGGRAPH '87), 21(4), (1987), pp. 163-169.

K.Kase, Y.Teshima, S.Usami, H.Ohmori, C.Teodosiu and A. Makinouchi, "Volume CAD", Volume Graphics 2003 Eurographics/ IEEE TCVG Workshop Proceedings, I.Fujishiro, K. Mueller, A.Kaufman(eds.) pp. 145-150, pp. 173,(2003).

Y.Teshima, K.Kase, S.Usami, M.Kato, N. Ikeda, and A.Makinouchi, "Enumeration of Cuttting Points Configuration in Cube Cutting", Proceedings of the fourth international symposium on Human and Artificial Intelligence Systems, (2004),pp. 407-414.

International Search Report issued in corresponding application No. PCT/JP2006/303963, completed May 26, 2006 and mailed Jun. 6, 2006.

Fig.5A Fig.5B Fig.5C input
triangle mesh

D-polyhedron
approximation

V-polyhedron
approximation

Fig.6

V-polyhedron approximation of cam shaft
(numbers of cell: 360×60×60)

Fig.7A　　　　Fig.7B　　　　Fig.7C input
triangle mesh

D-polyhedron
approximation

V-polyhedron
approximation

METHOD AND PROGRAM FOR GENERATING BOUNDARY SURFACE INFORMATION

This is a National Phase Application in the United States of International Patent Application No. PCT/JP2006/303963 filed Mar. 2, 2006, which claims priority on Japanese Patent Application No. 065929/2005, filed Mar. 9, 2005. The entire disclosures of the above patent applications are hereby incorporated by reference.

TECHNICAL FIELD OF THE INVENTION

The present invention relates to a method and a program for generating boundary surface information in which boundary shape information is linearly approximated in a grid using a dual.

DESCRIPTION OF THE RELATED ART

In the field of research and development/technical developments, computer aided design (CAD), computer aided manufacturing (CAM), computer aided engineering (CAE), computer aided testing (CAT) and the like are used as simulation means of designing, fabricating, analyzing and testing.

Furthermore, different types of simulation are conducted continuously or a simulation result is operatively associated with a fabrication process while sharing one volume data therebetween, which are also being widely spread.

In the case of the above-mentioned conventional simulation means, boundary information on an object is important, and boundary shape information has to be represented using a computer.

As means for representing such boundary shape information, Non-Patent Documents 1 to 9 and Patent Documents 1 and 2, for example, have been already proposed.

The means of Non-Patent Document 1 is based on so-called linear interpolation, in which when original boundary information indicates a parametric curved surface, sampling points are taken at regular intervals on a parameter plane, or a distance from a triangle obtained by approximation or a differential geometric quantity thereof are determined and further inserted therebetween, and points on the curved surface corresponding to such sampling points are connected into a triangle for first-order approximation (tessellation).

According to this means, however, there is no relation with a grid, and therefore this means is unsuitable for division when large scale data is to be processed, and moreover the relation with volume data as three-dimensional information also is small. Additionally, since there are no guarantees that the entire boundary surface is closed, the robustness of volume rendering is not ensured.

That is to say, when boundary shape information is represented using a computer, it is common as in Non-Patent Document 1 that points are arranged freely in a space and they are connected into a triangle or other curved surfaces (parametric representation). However, when operation such as their deformation or set operation (i.e., interference between boundaries is determined and then a solid surrounded by the boundaries is determined based on a set sum, a difference and a cap) is performed, it is widely known from Non-Patent Document 6, the 1st chapter "Failure of algorithm due to numerical errors" for example that the mounting by floating-point representation that is currently used will cause a failure of such operation in principle.

Such failure results from an error in the floating-point representation, and includes (1) limitation of resolution, (2) comprehensive influences, (3) contradiction in a phase structure, (4) runaway of algorithm and the like.

According to the means of Non-Patent Document 2, a cutting point is provided at each side of a voxel by a method similar to that for volume data, thus enabling the further representation of an acuate point and a sharp side within the voxel as a vector originating from the cutting point. Although this simulation method is compatible with volume data, it has drawbacks, for example, that the process is complicated because information has to be contained inside a cell and the data amount is increased. In other words, this means lacks the simplicity and robustness of algorithm and the steps for achieving accuracy.

Although the means of Non-Patent Document 3 is compatible with volume data, it has drawbacks, for example, that it is inferior in robustness because the means lacks the accuracy required for representing inner points and the concept for resolution, and the accuracy of the approximation is not clear.

According to the means of Non-Patent Document 4, boundary shape information originally inputted is represented as a triangle mesh obtained by connecting any given group of points, to which only one point is added in a cell, thus enabling the representation of internal acuate points and sharp sides. A dual is further taken, to which linear conversion is applied for scaling so as to bring it closer to the original one. This means, however, has drawbacks of the difficulty in division because there is no relation with a grid and an inability to be converted into volume data, for example.

According to the means of Non-Patent Document 5, boundary shape information originally inputted is represented as an initial triangle mesh obtained by connecting any given group of points, and a dual and a normal vector are used to achieve the representation of acuate points and sharp sides that cannot be represented by the initial triangle mesh. This means, however, has drawbacks that it is not applicable to volume data, for example.

Non-Patent Document 6 discloses a method of obtaining first-order approximation (piecewise linear interpolation) of a height field (data in which a respective point has only a height) by forming a Delaunay triangle. According to this means, although the approximation can be determined uniquely, it has drawbacks that surface data in only one direction (which can be represented as $z=f(x, y)$) can be obtained as boundary information.

Non-Patent Document 7 discloses already available Cube-base means that is generated from volume data (isosurfaces are formed based on gray levels at vertexes by intermediate value theorem). This means, however, has a problem that almost only one kind of interpolation surface can be formed.

Non-Patent Documents 8 and 9 are papers published in connection with the present invention.

The means of Patent Document 1 relates to a volume data generation method in connection with the present invention.

The means of Patent Document 2 discloses a specific example of volume data having boundary surfaces in a cell in connection with the present invention.

[Non-Patent Document 1]
J. Peterson, "Tessellation of NURB Surfaces", Graphics Gems IV, edited by P. Heckbert, Academic press, pp, 286-320, (1994)

[Non-Patent Document 2]
L. Kobbelt, M. Botsch, U. Schwanecke, and H.-P. Seidel, "Feature-sensitive surface extraction from volume data", In Proceedings of SIGGRAPH2001, ACM Press/ACM SIGGRAPH, Computer Graphics Proceedings, Annual Conference Series, pp. 57-66, (2001).

[Non-Patent Document 3]

T., Ju, R. Losasso, S. Schaefer, and J. Warren, "Dual contouring of Hermite data", ACM Transactions of Graphics Vol. 21 No. 3, (Proc. of ACM SIGGRAPH 2002), pp. 339-346, (2002).

[Non-Patent Document 4]

G. Taubin, "Dual mesh resampling", Proc. of Paciphic Graphics, pp. 180-188 (2001).

[Non-Patent Document 5]

Y. Ohtake et al., "Dual/Primal mesh optimization", 7th ACM Simposium on Solid Modeling and Application, pp. 171-178, (2002).

[Non-Patent Document 6]

Kokichi SUGIHAPA, Computational Geometry in Engineering (in Japanese), Baifu-kan, Tokyo, 1994

[Non-Patent Document 7]

W. Lorensen and H. Cline, "Marching cubes: high resolution 3D surface construction algorithm", ACM Computer Graphics (Proc. of ACM SIGGRAPH '87), 21(4), (1987), pp. 163-169.

[Non-Patent Document 8]

K. Kase, Y. Teshima, S. Usami, H. Ohmori, C. Teodosiu and A. Makinouchi, "Volume CAD", Volume Graphics 2003 Eurographics/IEEE TCVG Workshop Proceedings, I. Fujishiro, K. Mueller, A. Kaufman (eds.) pp. 145-150, pp. 173, (2003).

[Non-Patent Document 9]

Y. Teshima, K. Kase, S. Usami, M. Kato, N. Ikeda, and A. Makinouchi, "Enumeration of Cutting Points Configuration in Cube Cutting", Proceedings of The fourth international symposium on Human and Artificial Intelligence Systems, (2004), pp. 407-414.

[Patent Document 1]

Japanese Patent No. 3468464, "METHOD FOR GENERATING VOLUME DATA OBTAINED BY INTEGRATING SHAPE AND PHYSICAL PROPERTY"

[Patent Document 2]

WO 03/073335 brochure "METHOD AND PROGRAM FOR CONVERTING BOUNDARY DATA INTO IN-CELL SHAPE"

As described above, when boundary shape information is represented using a computer, it is conventionally common that points are arranged freely in a space and they are connected into a triangle or other curved surfaces (parametric representation). However, such a mounting method using floating-point representation has the problems of causing a failure in principle resulting from (1) limitation of resolution, (2) comprehensive influences, (3) contradiction in phase structure and (4) runaway of algorithm, for example.

It is an object of the present invention to provide a method and a program for generating boundary surface information enabling the approximation and representation of boundary shape information (e.g., a surface shape of one object), which have been used for representing an object with large amount of data in the field of industry and technology, with smaller amount of data, and capable of preventing the above-described failure so as to process the data robustly.

SUMMARY OF THE INVENTION

According to the present invention, a method for generating boundary surface information using a computer is provided, the method including the steps of:

an input step of inputting information on a boundary surface of an object to the computer;

a grid sampling step of determining cutting points and normal vectors of the boundary surface at the cutting points, the cutting points being points at which the boundary surface cuts across edges of a predetermined rectangular parallelepiped grid, and storing the cutting points and the normal vectors in a storage unit as primary data;

a D-polyhedron data generation step of connecting adjacent cutting points with a line segment to form a triangle one by one for generating D-polyhedron data constituted of triangles only; and a V-polyhedron data generation step of generating V-polyhedron data constituted of intersections of a plurality of infinite planes passing through the cutting points and whose normals coincide with the normal vectors.

In this method, any one of the D-polyhedron data and the V-polyhedron data may be generated from the primary data, and the other may be generated as a dual of the one.

According to the present invention, a program for generating boundary surface information using a computer is provided, the program allowing the computer to execute the steps of:

an input step of inputting information on a boundary surface of an object to the computer;

a grid sampling step of determining cutting points and normal vectors of the boundary surface at the cutting points, the cutting points being points at which the boundary surface cuts across edges of a predetermined rectangular parallelepiped grid, and storing the cutting points and the normal vectors in a storage unit as primary data;

a D-polyhedron data generation step of connecting adjacent cutting points with a line segment to form a triangle one by one for generating D-polyhedron data constituted of triangles only; and a V-polyhedron data generation step of generating V-polyhedron data constituted of intersections of a plurality of infinite planes passing through the cutting points and whose normals coincide with the normal vectors.

According to the program, any one of the D-polyhedron data and the V-polyhedron data may be generated from the primary data, and the other may be generated as a dual of the one.

According to preferred embodiments of the present invention, in the case where a rate of change in the normal vectors of the primary data exceeds a predetermined threshold value, a size of the rectangular parallelepiped grid is divided by octree division and a step of generating primary data and storing the primary data is repeated so that cutting points and normal vectors are stored in a hierarchized manner.

According to the above-described method and program for generating boundary surface information of the present invention, the following effects can be obtained:

(1) since information on a boundary surface such as a curved surface can be stored as primary data constituted of cutting points and normal vectors in a storage unit, it can be stored with smaller amount of data and the approximation can be uniquely obtained by a computer at a high speed and in parallel (decentralized processing) as well as in a robust form with a required accuracy;

(2) the data amount of primary data constituted of cutting points and normal vector is small, and both of the D-polyhedron data and the V-polyhedron data can be easily generated from this data, thus allowing the approximation with a high accuracy, and a dual is mutually taken based on any one type of the D-polyhedron data and the V-polyhedron data, whereby mutual conversion of the data can be conducted without any loss of information and therefore the degree of freedom for representation can be doubled with the same amount of data;

(3) a polyhedron uniquely matching with a cell, which is obtained as a dual, can be obtained;

(4) D-polyhedron data and V-polyhedron data as well as primary data can be converted into volume data without being processed. Not only boundaries (two-dimension) but also many types of spaces surrounded by boundaries (three-dimension) can be easily processed by a computer; and (5) in a dual polyhedron, since just a surface (constituted of vertexes, edges and planes) of a cell as a processing unit, which has been obtained by dividing a space, can be considered, processing can be limited, and therefore integrity and stability of algorithm can be expected with consideration given to the computer resource.

DESCRIPTION OF THE PREFERRED EMBODIMENT

Preferred embodiments of the present invention will be described below with reference to the drawings.

Figure 1:
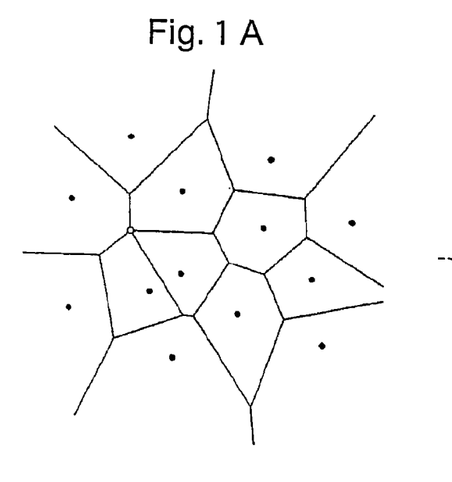
FIGS. 1A and 1B are views for explaining a dual and dual graphics of the present invention.

FIG. 1A and FIG. 1B are views for explaining a dual and dual graphics of the present invention. In these drawings, FIG. 1A is a schematic view of a Voronoi diagram and FIG. 1B is a schematic view of a Delaunay diagram. Firstly, the dual and the dual graphics will be described below with reference to these drawings.

It is assumed that R denotes a set of real numbers in the aggregate, a pair of two real numbers (x, y) is regarded as a coordinate on a plane, and a set constituted of such pairs as a whole is equated with the plane. It is further assumed that a set of points in a finite number designated on a plane is represented as $P=\{p_1, p_2, \ldots, p_n\}$. Herein, a Euclid distance between two points p and q is written as d(p, q).

Defining that $V(p_i)$ denotes "a region constituted of points on a plane with a distance to $p_i$ being smaller than a distance to other points belonging to P", $V(p_i)$ indicates a convex polygon, and $\{V(p_1), V(p_2), \ldots, V(p_n)\}$ provides a division of the plane. Such a division is called a Voronoi diagram for P, which is described as Vor(P).

Points belonging to P are called generatrices of the Voronoi diagram, $V(p_i)$ is called a Voronoi region for a generatrix $P_i$, a line segment shared by boundaries of two Voronoi regions is called a Voronoi side, and a point shared by three or more Voronoi regions is called a Voronoi point.

When $V(p_i)$ and $V(p_j)$ share a Voronoi side, another division of the plane can be obtained by connecting $p_i$ and $p_j$ with the side. The resultant is called a Delaunay diagram for P, which is described as Del(P).

In FIG. 1B, the Delaunay diagram for the same generatrices set as in FIG. 1A is shown with solid lines. In this drawing, the corresponding Voronoi diagram is further shown with broken lines.

Line segments shown in a Delaunay diagram are called Delaunay sides, and polygons obtained by making a division in a Delaunay diagram are called Delaunay polygons.

Voronoi diagrams and Delaunay diagrams have the following correspondence relationship. A Voronoi region is in one-to-one correspondence with a vertex (i.e., a generatrix) of a Delaunay diagram, a Voronoi point is in one-to-one correspondence with a Delaunay polygon and a Voronoi side is in one-to-one correspondence with a Delaunay side.

Such two diagrams corresponding to each other are called mutually dual graphics, and such a relationship is called a dual. Note here that although a pair of two real numbers (x, y) is regarded as a coordinate on a plane in the above-described example, this is applicable to any shape as it is.

Figure 2:
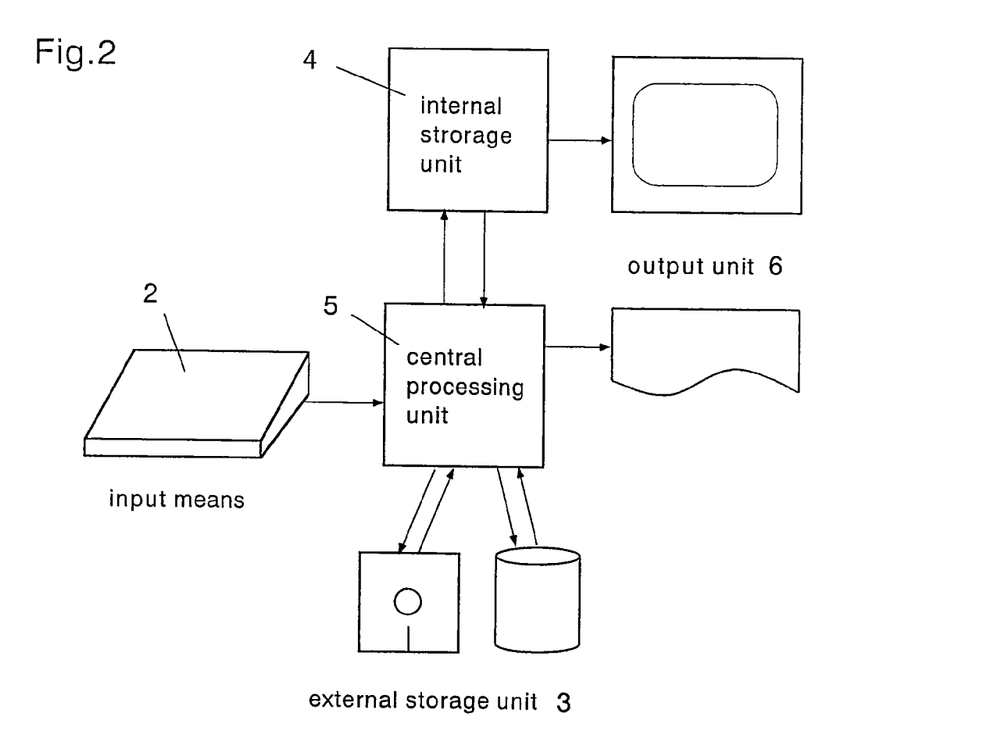
FIG. 2 shows the configuration of an apparatus for implementing a method of the present invention.

FIG. 2 shows the configuration of an apparatus for implementing a method of the present invention. As shown in this drawing, this apparatus is provided with external data input means 2, an external storage unit 3, an internal storage unit 4, a central processing unit 5 and an output unit 6.

The external data input means 2 may be a keyboard, for example, through which boundary surface information on an object is inputted. The external storage unit 3 may be a hard disk, a floppy disk, a magnetic tape, a compact disk or the like, which is for storing primary data, D-polyhedron data and V-polyhedron data described later as well as the relevant volume data and a generation program therefor. The internal storage unit 4 may be a RAM, a ROM or the like, which is for storing computing information. The central processing unit (CPU) 5 processes computation, input/output or the like centrally, and executes a program in cooperation with the internal storage unit 4. The output unit 6 may include a display unit and a printer, for example, from which the stored primary data, D-polyhedron data and V-polyhedron data as well as the relevant volume data and execution results of the program are outputted.

The central processing unit 5, the internal storage unit 4 and the external storage unit 3 cooperate to execute a method for generating boundary surface information described later using a generation program therefor.

The inventors of the present invention have already invented and filed "a method for generating volume data obtained by integrating shape and physical property" (Patent Document 1). This patent relates to a method for storing substance data, by which substance data that integrates a shape and physical properties can be stored with a small storage capacity, so that a shape, a structure, physical property information and hysteresis of an object are managed in a unified manner so as to enable the management of data regarding a series of processes from designing to fabricating, assembling, testing, evaluation and the like based on the same data, and thus it is possible to unify CAD and simulation. Data obtained by this method is called "V-CAD data" or "volume data", and designing scheme and simulation using this data are called "volume CAD" or "V-CAD".

A method and a program for generating boundary surface information of the present invention are particularly suitable for the application to this volume data.

Figure 3:
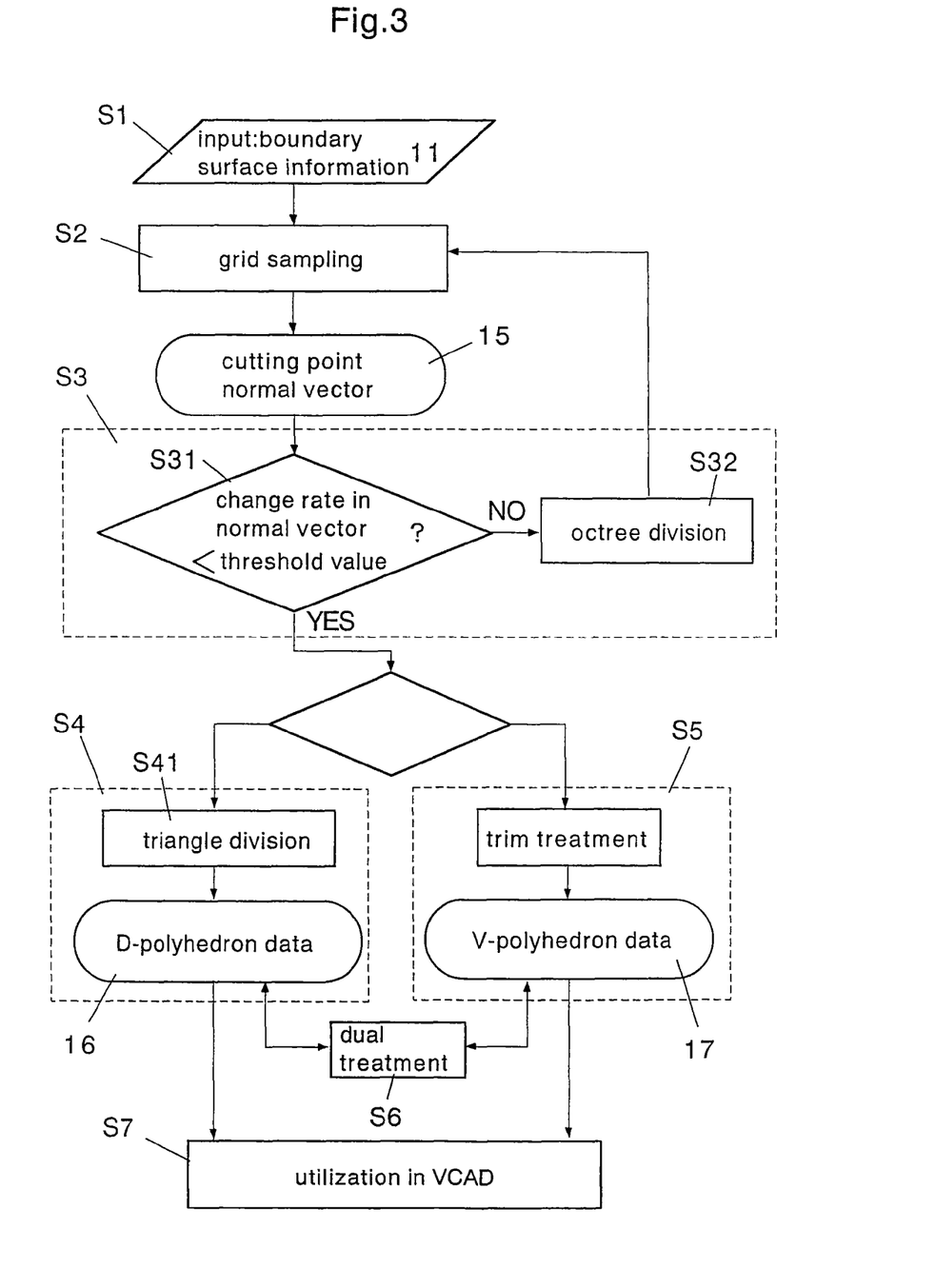
FIG. 3 is a flowchart of a method of the present invention.
Figure 4A:
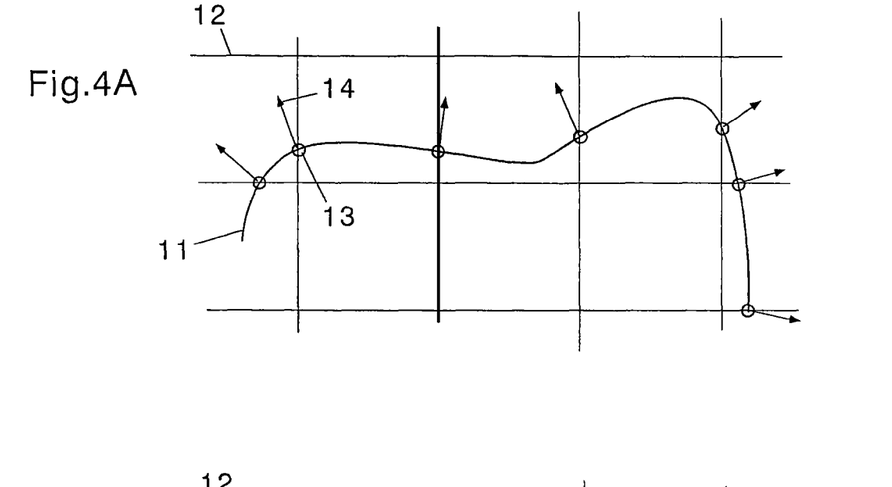
FIGS. 4A, 4B and 4C schematically show a method of the present invention.
Figure 4B:
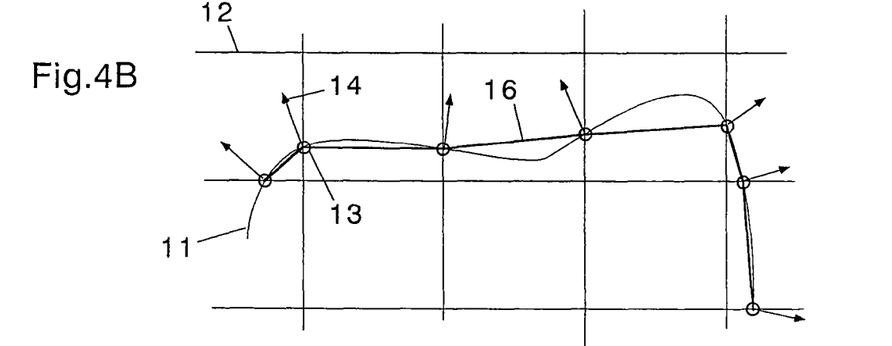
Figure 4C:
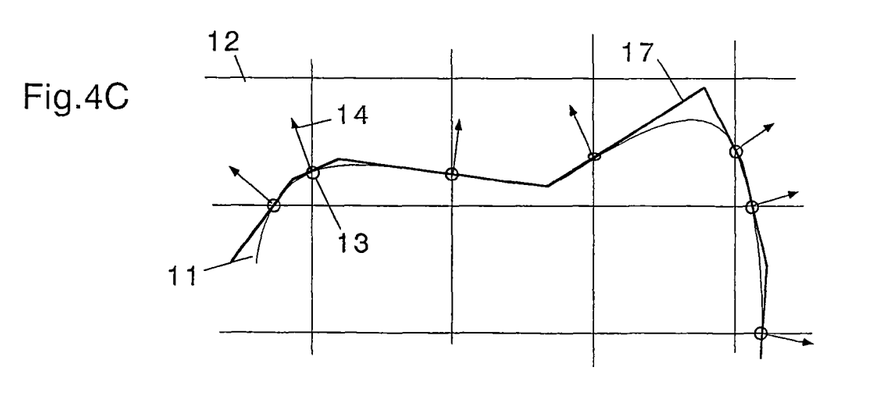

FIG. 3 is a flowchart showing a method of the present invention, and FIGS. 4A, 4B and 4C schematically illustrate the method.

Referring to FIG. 3, according to the method of the present invention, respective steps are executed using a computer, including input S1, grid sampling S2, octree division S3, D-polyhedron data generation S4, V-polyhedron data generation S5 and dual processing S6.

In input step S1, boundary surface information 11 on an object is inputted to a computer using the computer.

The boundary surface information 11 on an object externally inputted may be polygon data indicating a polyhedron, a tetrahedron or hexahedral element for use in a finite-element method, curved-surface data for use in three-dimensional CAD or a CG tool or data in which a surface of another solid is represented with information constituted of a partial plane or curved surface.

In addition to such data (called S-CAD data), the boundary surface information may be (1) data directly created through input by a human using an interface unique to V-CAD (V-interface), (2) digitized data on a surface by a measuring instrument, a sensor, a digitizer or the like and (3) Volume data containing internal information such as voxel data for CT scanning, MRI and generally used for Volume rendering.

In grid sampling step S2, as shown in FIG. 4A, cutting points 13 and normal vectors 14 are determined and stored in a storage unit as primary data 15, wherein the cutting point 13 is a point at which a boundary surface cuts across an edge of a predetermined rectangular parallelepiped grid 12, and the normal vector 14 is a vector of the boundary surface at the cutting point 13.

That is, according to the method of the present invention, after input step S1, intersections of all edges of the rectangular parallelepiped grid 12 and the surface 11 of the original shape are considered, and locations of the intersections 13 (called cutting points) and normal vectors 14 of the original shape surface at the intersections are acquired.

Note here that data containing differential quantities of a tangent and a normal also may be used for higher-order interpolation in addition to the location of a cutting point.

In octree division step S3, in the case where a rate of change in the normal vectors 14 of the primary data 15 exceeds a predetermined threshold value, the size of the rectangular parallelepiped grid 12 is divided by octree division S32, and then step S2 of generating and storing primary data is repeated so that the cutting points 13 and the normal vectors 14 are stored in a hierarchized manner. The size of the threshold for a rate of change may be set in accordance with a required accuracy.

In D-polyhedron data generation step S4, as shown in FIG. 4B, cutting points 13 adjacent to each other are connected with a line segment to form a triangle one by one (triangle division S41), whereby D-polyhedron data 16 constituted of triangles only is generated.

Herein, a D-polyhedron refers to a polyhedron constituted of triangles only obtained by focusing attention on a certain cutting point and connecting the cutting point to another cutting point located closer thereto with a line segment to generate a triangle one by one.

In V-polyhedron data generation step S5, V-polyhedron data 17 is generated, which is constituted of intersections of a plurality of infinite planes passing through the cutting points 13 and whose normals coincide with the above-described normal vectors 14.

In this step S5, the surface 11 of the original shape is approximated using a polyhedron based on the intersections of a large number of infinite planes. Herein, each of the infinite planes passes through a cutting point 13 of the data acquired at grid sampling step S2 and a normal of the infinite plane is made to coincide with a normal vector 14 obtained by the grid sampling.

Furthermore, among the polygons obtained by the intersections of the infinite planes, only those including the cutting points (the foot of the normal vectors) are left, and other polygons and half planes are all removed, thereby obtaining a polyhedron approximated to the surface of the original shape (since planes of this polyhedron have a similarity to a two-dimensional Voronoi polygon, the polyhedron will be referred to as a V-polyhedron hereinafter).

When the surface of the original shape is approximated, the cutting points 13 and the normal vectors 14 are used as main data (primary data) (these two types of data determines infinite planes), while edge lines, vertexes and polygons making up a V-polyhedron are used as secondary data indicating intersections of infinite planes.

Further, in steps S4 and S5, any one of the D-polyhedron data 16 and the V-polyhedron data 17 may be selected depending on the shape of a boundary surface, and the selected one is generated based on primary data, and the other one may be generated as a dual of the one by dual processing S6.

A V-polyhedron may include a concave shape also. In the case of a convex shape, a V-polyhedron can be generated reliably. In the case of the concave shape, however, the surface of the shape includes an inflection point, and therefore the above-described intersections of infinite planes do not provide desired points and lines of intersections. In such a case, it is preferable that a D-polyhedron (called this way after a Delauny triangle) is generated in advance and a V-polyhedron is obtained as a dual thereof.

A dual mentioned here has the same meaning as that of a dual concerning a two-dimensional Voronoi polygon group and a Delauny triangle group shown in FIGS. 1A and 1B. That is, the dual can be understood in terms of a two-dimensional graph in which a plane and a point as well as a line and a line are interchanged while assigning an equal status thereto from the graph theoretic approach.

Moreover, a cutting point 13 obtained at the above-described grid sampling S2 is a vertex of a Delauny triangle and is one point on a Voronoi polygon. A normal vector 14 obtained by the grid sampling specifies the direction of a plane of the Voronoi polygon. Accordingly, since a shape dealt with in the practical technical field includes a concave portion in most cases, it is preferable that a D-polyhedron is firstly generated for the mounting and a V-polyhedron is obtained as a dual thereof.

A Kitta Cube (hereinafter called KC) described in the related patent also is a polyhedron constituted of triangles only. A triangle of KC lies within a respective grid (a respective rectangular parallelepiped). A triangle making up a D-polyhedron does not necessarily lie within a respective grid and may lie across two or more grids. Thus, a KC plane usually does not correspond to a D-polyhedron. If a restraint condition specifying that a triangle lies within a respective grid is added to generate a D-polyhedron, the thus generated D-polyhedron provides a KC plane. A V-polyhedron can be obtained as a dual of the KC plane.

Further, as shown in FIG. 3, in application step S7 for the V-CAD, the above-described primary data, D-polyhedron data, V-polyhedron data and volume data relating to these data are used to perform simulation processing such as structure analysis, large deformation analysis, thermal/fluid analysis, fluid flow analysis, removal fabrication, addition fabrication or deformation fabrication using a computer.

In the simulation processing, simulation for designing, analyzing, fabricating as well as computer aided manufacturing (CAM), assembling or testing, for example, is performed using physical property values of each cell. A result of the simulation is outputted by output means to a printer, an external NC unit or the like.

A program for generating boundary surface information of the present invention is a computer program stored in the external storage unit 3 or the internal storage unit 4, by which the above-described method is implemented using the above-described computer.

Furthermore, this program also contains a dual processing program by which any one of the D-polyhedron data and the V-polyhedron data is generated from the above-described primary data and the other one is generated as a dual of the one.

FIRST EMBODIMENT

Figure 5A:
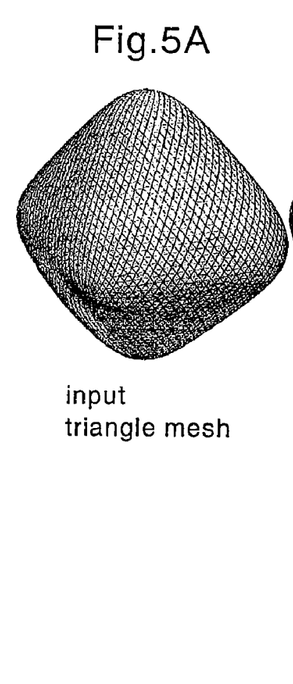
FIGS. 5A, 5B and 5C illustrate a first embodiment of the present invention.
Figure 5B:
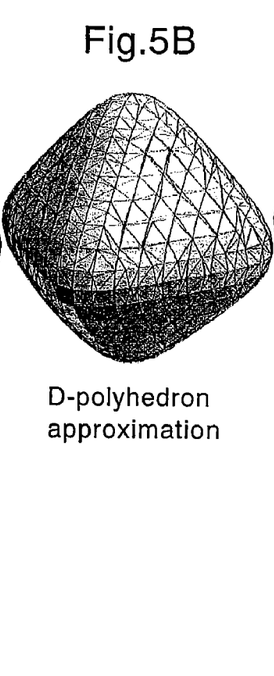
Figure 5C:
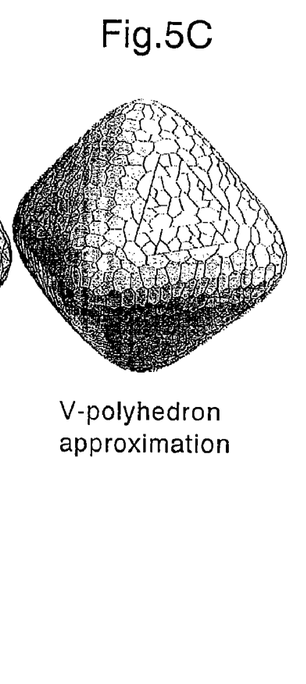

FIGS. 5A, 5B and 5C illustrate a first embodiment of the present invention. In these drawings, FIG. 5A is a triangle mesh diagram of inputted boundary surface information, FIG. 5B shows the approximation of FIG. 5A with a D-polyhedron and FIG. 5C shows the approximation of FIG. 5B with a V-polyhedron.

It is understood from the comparison of these drawings that although both of the D-polyhedron and the V-polyhedron have the cutting points in number significantly reduced from that of FIG. 5A, they can represent appropriate first-order approximation of the inputted information.

SECOND EMBODIMENT

Figure 6:
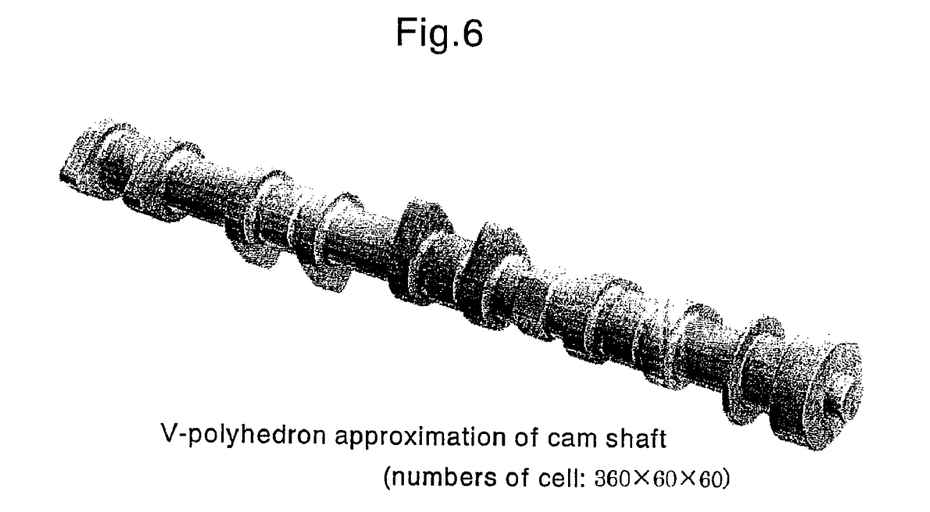
FIG. 6 illustrates a second embodiment of the present invention.
Figure 7A:
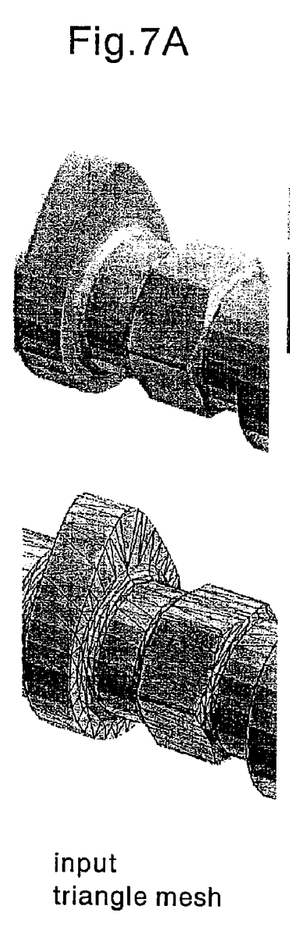
FIGS. 7A, 7B and 7C are partially enlarged views of FIG. 6.
Figure 7B:
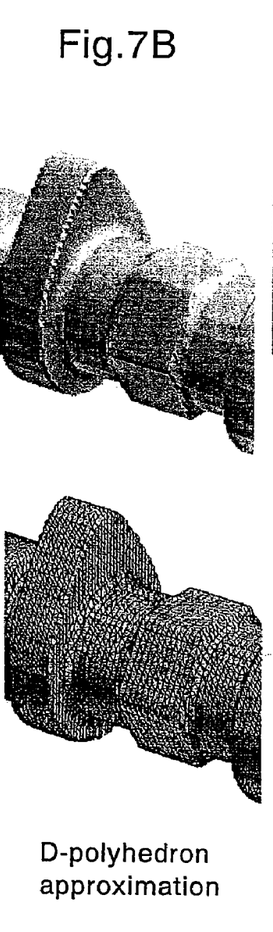
Figure 7C:
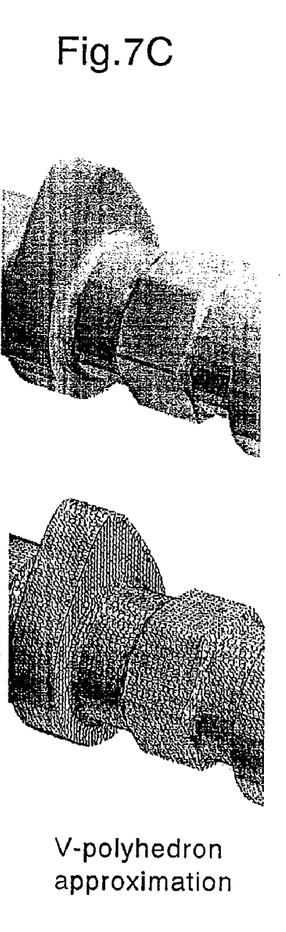

FIG. 6 is the overall view of a second embodiment of the present invention, and FIGS. 7A, 7B and 7C are partially enlarged views of FIG. 6. FIG. 6 shows the V-polyhedron approximation, FIG. 7A is a triangle mesh diagram of the inputted boundary surface information, FIG. 7B shows the approximation of FIG. 7A with a D-polyhedron and FIG. 7C shows the approximation of FIG. 7B with a V-polyhedron.

It is understood from the comparison of these drawings also that although both of the D-polyhedron and the V-polyhedron have the cutting points in number significantly reduced from that of FIG. 7A, they can represent appropriate first-order approximation of the inputted information.

As described above, the present invention has the following features:

(1) at one point (cutting point 13) within each section of a three-dimensional rectangular parallelepiped grid 12, the location of boundary surface information 11 is replaced with a normal vector 14 (attitude) and a connection relationship between the cutting points 13;

(2) each rectangular parallelepiped grid 12 of (1) is further allowed to have a hierarchized structure by octree with consideration given to a rate of change in the normal vector 14, whereby a polyhedron subjected to appropriate first-order approximation of the input can be obtained based on the cutting points and the normal vectors on the cutting points;

(3) A dual is taken by using the polyhedron obtained at (1) and normal vectors on the cutting points (reversible operation by which a surface is replaced with a point and vice versa, and a line is replaced with another line using a line connecting points), whereby a polyhedron as first-order (plane) approximation can be obtained with a spatial resolution whose input boundary is designated; and (4) precise representation of cutting points that is represented with integers, which is obtained by dividing each section of the grid by 2 to the n-th power (which relates to the effect (5), and when division is carried out i-times by octree division, positions of cutting points agree with each other even between grids in different levels of the hierarchy by the division of 2 to the n-i power).

Note here that the present invention is not limited to the above-described embodiments, and it will be appreciated that various modifications may be made in the present invention without departing from the spirit or essential characteristics thereof.

The invention claimed is:

1. A method for generating boundary surface information using a computer, the method comprising the steps of:

(a) performing an input step comprising inputting information on a boundary surface of an object to the computer;

(b) performing a grid sampling step comprising determining cutting points and normal vectors of the boundary surface at the cutting points, wherein the cutting points are points at which the boundary surface cuts across edges of a predetermined rectangular parallelepiped grid, and storing the cutting points and the normal vectors in a storage unit as primary data, and wherein, in the case where a rate of change in the normal vectors of the primary data exceeds a predetermined threshold value, a size of the rectangular parallelepiped grid is divided by octree division, and generation of primary data, and the storage of the primary data, are repeated so that cutting points and normal vectors are stored in a hierarchized manner;

(c) performing a D-polyhedron data generation step comprising connecting adjacent cutting points with a line segment to form a triangle one by one for generating D-polyhedron data constituted of triangles only; and (d) performing a V-polyhedron data generation step comprising generating V-polyhedron data constituted of intersections of a plurality of infinite planes passing through the cutting points and whose normals coincide with the normal vectors;

wherein when the D-polyhedron data is generated from the primary data, the V-polyhedron data is generated as a dual of the D-polyhedron data, and when the V-polyhedron data is generated from the primary data, the D-polyhedron data is generated as a dual of the V-polyhedron data.

2. A program for generating boundary surface information using a computer, wherein the program is stored in a storage unit operably connected to a central processing unit of the computer, wherein the program causes the computer to execute the steps of:

(a) performing an input step comprising inputting information on a boundary surface of an object to the computer;

(b) performing a grid sampling step comprising determining cutting points and normal vectors of the boundary surface at the cutting points, wherein the cutting points are points at which the boundary surface cuts across edges of a predetermined rectangular parallelepiped grid, and storing the cutting points and the normal vectors in a storage unit as primary data, and wherein, in the case where a rate of change in the normal vectors of the primary data exceeds a predetermined threshold value, a size of the rectangular parallelepiped grid is divided by octree division, and generation of primary data, and storage of the primary data, are repeated so that cutting points and normal vectors are stored in a hierarchized manner;

(c) performing a D-polyhedron data generation step comprising connecting adjacent cutting points with a line segment to form a triangle one by one for generating D-polyhedron data constituted of triangles only; and (d) performing a V-polyhedron data generation step comprising generating V-polyhedron data constituted of intersections of a plurality of infinite planes passing through the cutting points and whose normals coincide with the normal vectors;

wherein when the D-polyhedron data is generated from the primary data, the V-polyhedron data is generated as a dual of the D-polyhedron data, and when the V-polyhedron data is generated from the primary data, the D-polyhedron data is generated as a dual of the V-polyhedron data.

* * * * *